United States Patent [19]
Pontarollo

[11] Patent Number: 5,986,861
[45] Date of Patent: Nov. 16, 1999

[54] CLAMP

[75] Inventor: Serge Pontarollo, Pont de Claix, France

[73] Assignee: SGS-Thomson Microelectronics S.A., Saint Genis, France

[21] Appl. No.: 08/653,958

[22] Filed: May 22, 1996

[30] Foreign Application Priority Data

May 24, 1995 [FR] France ................................. 95 06405

[51] Int. Cl.⁶ ........................................................ H02H 9/00
[52] U.S. Cl. ............................................ 361/56; 361/91.5
[58] Field of Search ................................. 361/18, 56, 58, 361/91, 111, 118, 119; 257/355–365

[56] References Cited

U.S. PATENT DOCUMENTS

| | | | |
|---|---|---|---|
| 3,636,385 | 1/1972 | Koepp | 361/56 |
| 5,023,542 | 6/1991 | Banura | 361/18 |
| 5,239,440 | 8/1993 | Merrill | 361/91 |
| 5,345,357 | 9/1994 | Pianka | 361/56 |
| 5,400,202 | 3/1995 | Metz et al. | 361/56 |
| 5,418,411 | 5/1995 | Michel et al. | 327/313 |
| 5,452,171 | 9/1995 | Metz et al. | 361/56 |
| 5,526,214 | 6/1996 | Takata et al. | 361/56 |
| 5,745,323 | 4/1998 | English et al. | 361/56 |
| 5,825,601 | 10/1998 | Statz et al. | 361/56 |
| 5,838,146 | 11/1998 | Singer | 361/56 |

OTHER PUBLICATIONS

French Search Report from French Patent Application No. 95 06405, filed May 24, 1995.

*Primary Examiner*—Ronald W. Leja
*Attorney, Agent, or Firm*—Wolf, Greenfield & Sacks, P.C.

[57] ABSTRACT

This invention relates to a device for protecting a circuit against voltage surges, including a MOS transistor of a first type connected to first and second supply terminals by its source and its drain, respectively; a MOS transistor of a second type connected between the second supply terminal and the gate of the first type transistor, by its source and its drain, respectively; and a capacitor having a first terminal connected to the first supply terminal and a second terminal connected to the gate of the second type transistor.

24 Claims, 2 Drawing Sheets

CLAMP

BACKGROUND OF THE INVENTION

1. Field of the Invention

The present invention relates to a clamp for protecting an integrated circuit against voltage surges which may occur between two terminals of the integrated circuit.

Voltage surges applied between two terminals of an integrated circuit can destroy the circuit. These voltage surges most often result from electrostatic discharges which can be inadvertently applied to the terminals of the integrated circuit in various circumstances. These circumstances may be a mere manipulation of the circuit by an operator whose fingers are brought to high electrostatic potentials by friction phenomena.

2. Discussion of the Related Art

FIG. 1 shows a conventional clamp 12. This device includes a bipolar NPN shunt transistor Q1 connected by its collector to terminal $V^+$ and by its emitter to terminal $V^-$. One or more Zener diodes 14 may be used to define the limit voltage between terminals $V^+$ and $V^-$, beyond which transistor Q1 turns on. The anode voltage of the Zener diodes 14 is applied to the base of transistor Q1 through a bipolar NPN follower transistor Q2. The bases of transistors Q1 and Q2 are connected to terminal $V^-$ through respective resistors 18 and 19.

With this configuration, transistor Q1 is turned on when the voltage between terminals $V^+$ and $V^-$ becomes higher than the value Vz+2Vbe, where Vz is the sum of the voltages of Zener diodes 14 and 2Vbe is the sum of the base-emitter voltages of transistors Q1 and Q2.

Transistor Q1 is chosen with a particularly low on-resistance. It has a size of, for example, 300 elementary transistors. Follower transistor Q2 is used to supply a base current sufficient for transistor Q1 and includes for this purpose, for example, 100 elementary transistors.

A drawback of this clamp is the difficulty in obtaining a well known Zener voltage Vz. This Zener voltage must be higher than the nominal supply voltage of the circuit but must be lower than the maximum admissible voltage before circuit breakdown.

This range is relatively narrow and it often happens that, from the construction, the Zener voltage obtained is too low so that the clamp starts operating as soon as the circuit is normally supplied. It also often happens that, during circuit operation, by mere thermal drift or aging, the Zener voltage decreases and activates the clamp while the circuit is normally supplied.

Another drawback of this clamp is that transistor Q1 can be destroyed by a long voltage surge, which, however, is insufficient to damage the circuit the clamp protects. As a result, transistor Q1 is permanently short-circuited, which makes the circuit inoperable, even though it is in working order.

Most prior art clamps used in fast technologies are implemented by means of bipolar transistors. An electrostatic discharge has an almost vertical voltage leading edge followed by a progressive decrease. It is essentially this initial voltage value that must be reduced. For this purpose, the clamp must be able to react almost instantaneously. Up to now, it has not been possible to obtain an efficient clamp in slow CMOS technologies (for example, HC1PA).

SUMMARY OF THE INVENTION

It is therefore an object of the present invention to provide an efficient clamp for slow CMOS technology, which eliminates the problem of ensuring an accurate and stable triggering voltage.

To achieve this and other objects, the present invention provides a device for protecting a circuit against voltage surges, including a MOS transistor of a first type connected to first and second supply terminals by its source and its drain, respectively; a MOS transistor of a second type connected between the second supply terminal and the gate of the transistor of the first type, by its source and its drain, respectively; and a capacitor having a first terminal connected to the first supply terminal and a second terminal connected to the gate of the transistor of the second type.

According to an embodiment of the present invention, the device includes a reverse connected diode between the gate and the source of the transistor of the second type.

According to an embodiment of the present invention, the transistor of the first type is a P-channel transistor, the first supply terminal being a positive supply terminal.

These objects, features and advantages, as well as others, of the present invention will be discussed in detail in the following description of specific embodiments, taken in conjunction with the following drawings, but are not limited by them.

DETAILED DESCRIPTION

Figure 1:
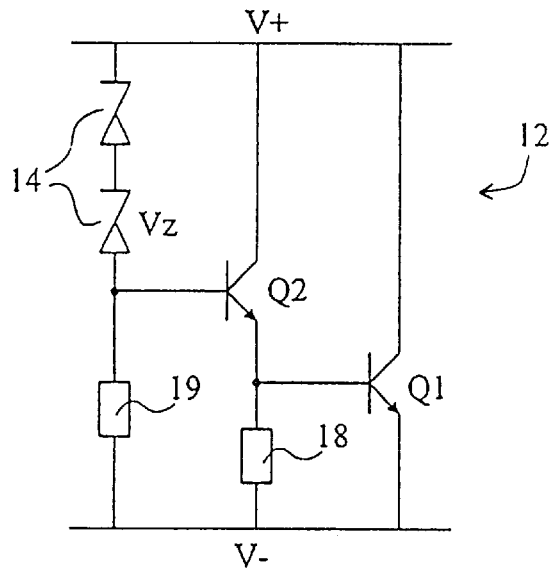
FIG. 1, previously described, shows a conventional clamp.
Figure 2:
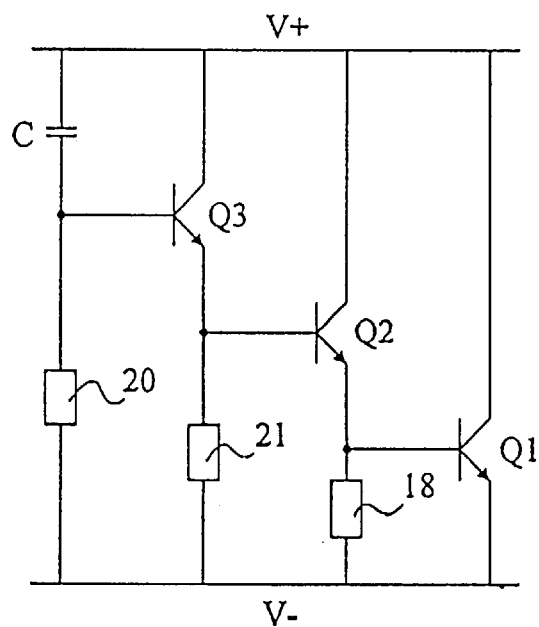
FIG. 2 shows an embodiment of a clamp which avoids the problem of ensuring a stable and accurate triggering voltage.

FIG. 2 shows a clamp including, like the clamp of FIG. 1, a transistor Q1, controlled by a follower transistor Q2, for short-circuiting supply terminals $V^+$ and $V^-$.

According to an aspect of the invention, a capacitor C is connected between terminal $V^+$ and the base of follower transistor Q2 via, optionally, an NPN follower transistor Q3. Capacitor C and the base of transistor Q3 are connected to terminal $V^-$ through a resistor 20. The base of transistor Q1 is connected to terminal $V^-$ through a resistor 18, as in FIG. 1, and the base of transistor Q2 is connected to terminal $V^-$ through a resistor 21.

With this configuration, the clamp is triggered, that is, transistor Q1 is turned on, when the voltage across resistor 20 becomes higher than 3Vbe (sum of the base-emitter voltages of transistors Q1 to Q3).

The voltage across resistor 20 essentially corresponds to the derivative of the voltage between terminals $V^+$ and $V^-$. Thus, the faster the voltage between terminals $V^+$ and $V^-$ increases, the higher the voltage across resistor 20.

In an electrostatic discharge, capacitor C does not have the time to charge through resistor 20, that is, the base voltage of transistor Q3 increases at a rate similar to the voltage on terminal $V^+$. In this case, transistor Q1 is turned on almost as soon as the voltage between terminals $V^+$ and $V^-$ becomes higher than 3Vbe, which results in eliminating a voltage surge.

Conversely, if the voltage between terminals $V^+$ and $V^-$ increases relatively slowly, for example when the circuit being protected is normally turned on, the voltage across resistor 20 remains under 3Vbe and the clamp is not triggered.

When a permanent voltage surge is applied, the clamp is not triggered either, at least not after the voltage between terminals $V^+$ and $V^-$ has reached a stable value. Therefore, transistor Q1 is not destroyed during permanent voltage surges which do not damage the circuit being protected.

The rate of the increase of voltage between terminals $V^+$ and $V^-$ which triggers the clamp is determined by the values of capacitor C, resistor 20, the turn-on voltage (3Vbe in FIG. 2) of transistor Q1, and the gain of transistors Q1 to Q3. A rate is chosen, for instance, which is higher than the rate of increase during normal turn-on of the circuit being protected.

In order to adapt the clamp for use in slow CMOS technology, such as the HC1PA technology, the bipolar transistors of the structure of FIG. 2 could be replaced by MOS transistors. However, the device thus obtained has proven to be inefficient because the circuit it is supposed to protect is destroyed in most cases, under normalized test conditions (a 100 picofarads capacity charged at 2 to 4 kilovolts and discharged in the circuit through a 1500 ohms resistance). This inefficiency is due to the clamp's inability to react to a surge quickly enough. The efficiency of the MOS shunt transistor which replaces transistor Q1 directly depends on its gate-source voltage. However, this gate-source voltage is lower than one third of the voltage across resistor 20, which follows the voltage of a voltage surge. Therefore, the voltage surge will have time to destroy the circuit before this gate-source voltage reaches a sufficient value for the shunt transistor to absorb the voltage surge.

It has been found that, in CMOS technologies, bipolar NPN transistors with a vertical structure can be utilized, the only restriction being that the collectors of these NPN transistors correspond to the substrate, that is, to positive supply terminal $V^+$. The circuit of FIG. 2, with bipolar transistors, can thus be realized in pure CMOS technology. However, tests have shown that the clamp obtained in this manner still is too slow to be efficient, due to the low speed of vertical bipolar transistors.

Figure 3:
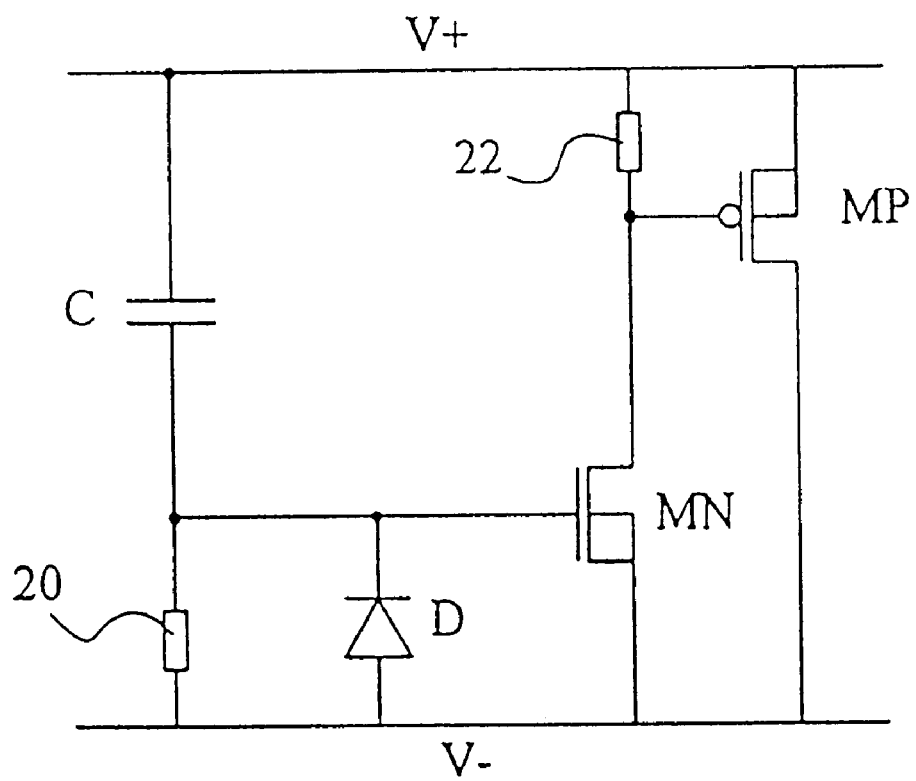
FIG. 3 shows an embodiment of a clamp according to the present invention.

FIG. 3 shows a clamp according to the present invention which is efficient even if implemented in slow CMOS technology. This device includes a P-channel MOS transistor MP connected between supply terminals $V^+$ and $V^-$ by its source and its drain, respectively. An N-channel MOS transistor MN is connected between the gate of transistor MP and terminal $V^-$ by its drain and its source, respectively. The gate of transistor MN is connected to terminal $V^+$ through a capacitor C. The gate and the source of each of transistors MN and MP are interconnected through a resistor, respectively 20 and 22, which serves to discharge the gate-source capacitance of the transistor.

During a voltage surge, capacitor C does not have the time to charge through resistor 20, that is, the gate voltage of transistor MN increases at a rate similar to the voltage on terminal $V^+$. As soon as this gate voltage reaches the threshold voltage of transistor MN, transistor MN turns on and draws the gate voltage of transistor MP towards voltage $V^-$. Thus, transistor MP also turns on and short-circuits terminals $V^+$ and $V^-$ to alleviate the voltage surge.

A reason for which the circuit of FIG. 3 is particularly fast is that the gate-source voltage of transistor MP quickly reaches a high value (equal to the circuit supply voltage) which makes it conductive enough to alleviate the voltage surge. Indeed, as soon as the gate voltage of transistor MN becomes greater than the transistor's threshold voltage by a given value, much lower than the value of the voltage surge, transistor MN enters a linear mode, that is, it behaves as a low value resistance, and brings the gate voltage of transistor MP almost back to voltage $V^-$. Transistor MN rapidly enters a linear mode, since the gate-source capacitance of this transistor constitutes, with capacitor C, a capacitive divider bridge which causes the gate voltage of transistor MN to vary proportionally to the voltage surge, the proportionality coefficient increasing with the increase of capacitor C.

In order to obtain a good compromise between the size of capacitor C and the turn-on speed of transistor MN, this transistor MN preferably is relatively small. As a result, transistor MN is not able to absorb the voltage surge which must be absorbed by the much larger transistor MP.

As an example, in a device according to the invention capable of absorbing voltage surges of 4 kV, transistor MN has a W/L ratio of 1,500/5, transistor MP a W/L ratio of 10,000/5, and capacitor C has a value of 8 picofarads. Resistors 20 and 22 have, for example, a value of 6 Kohms. If a voltage capacity of 2 kV is desired, the W/L ratio of transistor MP can be reduced to 5,000/5.

A device according to the invention, as that of FIG. 2, is triggered as soon as the voltage between terminals $V^+$ and $V^-$ changes rapidly. As previously indicated, in the device of FIG. 2, the components are chosen so that the device is not triggered for a normal turn-on. However, the circuit's supply source generally has a particularly low impedance, which could cause the destruction of the clamp if the device should be triggered.

Despite a judicious selection of the components, it is always possible to encounter the case where a normal turn-on triggers the device, and causes its destruction if it is constituted by bipolar transistors. Indeed, a saturated bipolar transistor has a very low on-resistance, and regardless of the current flowing through it, this resistance decreases as the transistor heats up, which quickly tends to destroy the bipolar transistor.

Conversely, the fact that the clamp according to the invention, as shown in FIG. 3, formed with MOS transistors, triggers during normal turn-on, is not a nuisance. MOS transistor MP tends to behave as a current source with a value determined by its gate-source voltage. Thus, the current which flows through it never goes over this value and, as long as it is lower than this value, transistor MP behaves as a low value resistance. Further, a MOS transistor has a positive thermal coefficient which tends to decrease the current which flows through the transistor when its temperature increases. These combined characteristics make the clamp according to the invention particularly robust.

Alternatively, the types of transistors MN and MP can be reversed, by inverting the polarities of the supply terminals $V^+$ and $V^-$. This has the advantage of reducing the surface occupied by the circuit, since the transistor which must bear the voltage surge is then an N-channel transistor which is approximately three times smaller than a P-channel transistor with the same characteristics. However, an N-channel MOS transistor has the disadvantage of having a parasitic bipolar transistor between its drain and its source. This parasitic bipolar transistor, bearing the current of the MOS transistor, decreases the robustness of the circuit because of its negative thermal coefficient.

As shown, a diode D is reverse connected between the gate and the source of transistor MN. This diode D prevents the gate voltage of transistor MN from becoming too negative with respect to voltage $V^-$. The gate voltage of transistor MN is equal to the voltage on terminal $V^+$ minus the voltage across capacitor C. Thus, if voltage $V^+$ quickly resumes its initial value, after a voltage surge, capacitor C does not have time to discharge through resistor 20, which causes a negative voltage surge between the gate and the source of transistor MN, which can lead to its destruction.

Of course, the present invention is likely to have various alterations and modifications, which will readily occur to those skilled in the art. Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and equivalents thereto.

What is claimed is:

1. A device for protecting a circuit against voltage surges, comprising:
    an MOS transistor of a first type directly connected to first and second supply terminals by its source and its drain, respectively;
    an MOS transistor of a second type directly connected between the second supply terminal and the gate of the transistor of the first type by its source and its drain, respectively; and
    a capacitor having a first terminal directly connected to the first supply terminal and a second terminal directly connected to the gate of the transistor of the second type.

2. The protection device according to claim 1, wherein a resistor interconnects the gate and the source of the MOS transistor of the first type.

3. The protection device according to claim 2, wherein the transistor of the first type is a P-channel transistor, and the first supply terminal is a positive supply terminal.

4. A device for protecting a circuit against voltage surges, comprising:
    an MOS transistor of a first type directly connected to first and second supply terminals by its source and its drain respectively;
    an MOS transistor of a second type directly connected between the second supply terminal and the gate of the transistor of the first type by its source and its drain respectively;
    a capacitor having a first terminal directly connected to the first supply terminal and a second terminal directly connected to the gate of the transistor of the second type; and
    a reverse connected diode between the gate and the source of the transistor of the second type.

5. The protection device according to claim 3, wherein the transistor of the first type is a P-channel transistor, and the first supply terminal is a positive supply terminal.

6. The protection device according to claim 1, wherein the transistor of the first type is a P-channel transistor, the first supply terminal being a positive supply terminal.

7. The protection device according to claim 1, wherein a resistor interconnects the gate and the source of the MOS transistor of the second type.

8. A protection device according to claim 7, further comprising a reverse connected diode between the gate and the source of the transistor of the second type and wherein the transistor of the second type has a faster turn-on rate than the transistor of the first type.

9. A protection device according to claim 7, further comprising a reverse connected diode between the gate and the source of the transistor of the second type and wherein the transistor of the second type has a smaller capacitance than the transistor of the first type.

10. A protection device according to claim 7, further comprising a reverse connected diode between the gate and the source of the transistor of the second type and wherein the transistor of the second type has a smaller W/L ratio than the transistor of the first type.

11. A protection device according to claim 1, wherein the transistor of the second type has a faster turn-on rate than the transistor of the first type.

12. A protection device according to claim 1, wherein the transistor of the second type has a smaller capacitance than the transistor of the first type.

13. A protection device according to claim 1, wherein the transistor of the second type has a smaller W/L ratio than the transistor of the first type.

14. A device for protecting a circuit from voltage surges comprising:
    a first means for switching coupled to a first power supply and directly connected to a second power supply;
    a second means for switching directly connected between said first power supply and said second power supply;
    a capacitor directly connected between said first means for switching and said first power supply;
    a first resistor directly connected between said first means for switching and said second power supply; and
    a second resistor directly connected between said second means for switching and said first power supply;
    wherein, upon the occurrence of a voltage surge on said first power supply, said first means for switching closes, thereby supplying a voltage to said second means for switching, which also closes, thereby causing a short-circuit between said first and second power supplies.

15. The device of claim 14, further comprising a third means for switching coupled between said first means for switching and said second power supply.

16. The device of claim 15, wherein said first means for switching comprises a transistor of a first type, said second means for switching comprises a transistor of a second type and said third means for switching comprises a diode.

17. The device of claim 16, wherein said transistor of a first type comprises an N-channel MOS transistor.

18. The device of claim 17, wherein said transistor of a second type comprises a P-channel MOS transistor.

19. The device of claim 18, wherein the transistor of the first type has a faster turn-on rate than the transistor of the second type.

20. The device of claim 18, wherein the transistor of the first type has a smaller capacitance than the transistor of the second type.

21. The device of claim 18, wherein the transistor of the first type has a smaller W/L ratio than the transistor of the second type.

22. The device of the claim 14, wherein the first means for switching has a faster turn-on rate than the second means for switching.

23. The device of claim 14, wherein the first means for switching has a smaller capacitance than the second means for switching.

24. The device of claim 14, wherein the first means for switching has a smaller W/L ratio than the second means for switching.

* * * * *

(12) EX PARTE REEXAMINATION CERTIFICATE (9999th)
United States Patent
Pontarollo

(10) Number: US 5,986,861 C1
(45) Certificate Issued: Jan. 9, 2014

(54) CLAMP

(75) Inventor: Serge Pontarollo, Pont de Claix (FR)

(73) Assignee: SGS-Thomson Microelectronics S.A., Gentilly (FR)

Reexamination Request:
No. 90/012,776, Jan. 30, 2013

Reexamination Certificate for:
Patent No.: 5,986,861
Issued: Nov. 16, 1999
Appl. No.: 08/653,958
Filed: May 22, 1996

(30) Foreign Application Priority Data

May 24, 1995 (FR) .................................... 95 06405

(51) Int. Cl.
*H01L 27/02* (2006.01)

(52) U.S. Cl.
CPC .................................. *H01L 27/0251* (2013.01)
USPC .......................................... 361/56; 361/91.5

(58) Field of Classification Search
None
See application file for complete search history.

(56) References Cited

To view the complete listing of prior art documents cited during the proceeding for Reexamination Control Number 90/012,776, please refer to the USPTO's public Patent Application Information Retrieval (PAIR) system under the Display References tab.

*Primary Examiner* — Joshua Campbell

(57) ABSTRACT

This invention relates to a device for protecting a circuit against voltage surges, including a MOS transistor of a first type connected to first and second supply terminals by its source and its drain, respectively; a MOS transistor of a second type connected between the second supply terminal and the gate of the first type transistor, by its source and its drain, respectively; and a capacitor having a first terminal connected to the first supply terminal and a second terminal connected to the gate of the second type transistor.

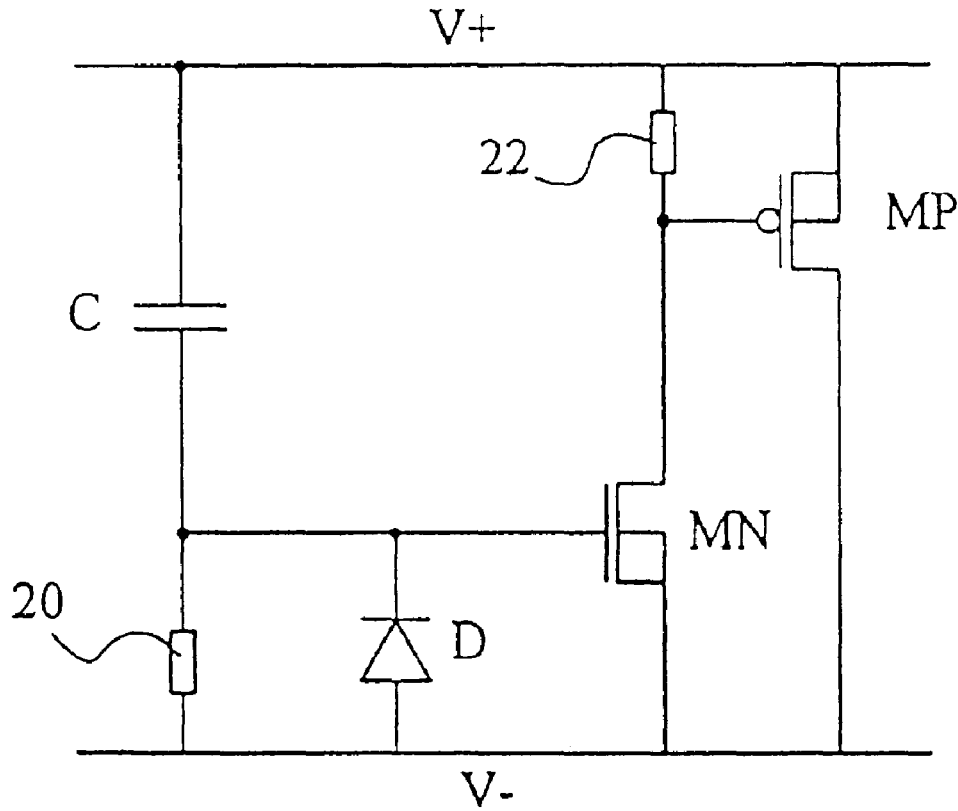

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 1 is confirmed.

New claims 25-27 are added and determined to be patentable.

Claims 2-24 were not reexamined.

*25. A device for protecting a circuit against voltage surges, comprising:*

*an MOS transistor of a first type directly connected to first and second supply terminals by its source and its drain, respectively;*

*an MOS transistor of a second type directly connected between the second supply terminal and the gate of the transistor of the first type by its source and its drain, respectively;*

*a capacitor having a first terminal directly connected to the first supply terminal and a second terminal directly connected to the gate of the transistor of the second type; and*

*wherein the transistor of the first type is configured to turn off in response to the expiration of a time constant defined by the capacitor following an electrostatic discharge that turns on the transistor of the first type.*

*26. A device for protecting a circuit against voltage surges, comprising:*

*an MOS transistor of a first type directly connected to first and second supply terminals by its source and its drain, respectively;*

*an MOS transistor of a second type directly connected between the second supply terminal and the gate of the transistor of the first type by its source and its drain, respectively;*

*a capacitor having a first terminal directly connected to the first supply terminal and a second terminal directly connected to the gate of the transistor of the second type; and*

*wherein the MOS transistor of the first type has a W/L ratio less than 10,000/5.*

*27. A device for protecting a circuit against voltage surges, comprising:*

*an MOS transistor of a first type directly connected to first and second supply terminals by its source and its drain, respectively;*

*an MOS transistor of a second type directly connected between the second supply terminal and the gate of the transistor of the first type by its source and its drain, respectively;*

*a capacitor having a first terminal directly connected to the first supply terminal and a second terminal directly connected to the gate of the transistor of the second type; and*

*wherein the MOS transistor of the second type has a W/L ratio less than 1,500/5.*

\* \* \* \* \*